United States Patent [19]
Merrill

[11] Patent Number: 5,841,158
[45] Date of Patent: Nov. 24, 1998

[54] LOW-STRESS PHOTODIODE WITH REDUCED JUNCTION LEAKAGE

[75] Inventor: Richard Billings Merrill, Daly City, Calif.

[73] Assignee: Foveonics, Inc., Cupertino, Calif.

[21] Appl. No.: 609,566

[22] Filed: Mar. 1, 1996

[51] Int. Cl.$^6$ ................................................ H01L 27/148
[52] U.S. Cl. .......................... 257/233; 257/292; 257/461
[58] Field of Search .................................. 257/232, 233, 257/250, 758, 222, 249, 292, 461

[56] References Cited

U.S. PATENT DOCUMENTS

| | | | |
|---|---|---|---|
| 4,206,003 | 6/1980 | Koehler | 257/442 |
| 5,070,032 | 12/1991 | Yuan et al. | 437/43 |
| 5,191,398 | 3/1993 | Mutoh | 257/216 |
| 5,210,433 | 5/1993 | Ohsawa et al. | 257/233 |
| 5,289,023 | 2/1994 | Mead | 257/291 |
| 5,371,397 | 12/1994 | Maegawa et al. | 257/233 |
| 5,506,429 | 4/1996 | Tanaka et al. | 257/233 |
| 5,552,619 | 9/1996 | Bergemont et al. | 257/291 |
| 5,566,044 | 10/1996 | Bergemont et al. | 361/321.1 |
| 5,614,744 | 3/1997 | Merrill | 257/291 |
| 5,637,893 | 6/1997 | Furumiya | 257/233 |
| 5,705,846 | 1/1998 | Merrill | 257/462 |

OTHER PUBLICATIONS

Fossum, E., Active–pixel sensors challenge CCDs, Technology Guide: Detector Handbook, *Laser Focus World*, Jun. 1993, pp. 83–87, Pasadena, CA.

Mendis, S. et al., Progress in CMOS Active Pixel Image Sensors, *SPIE* vol. 2172, (1994) Center for Space Microelectronics Tech., Jet Propulsion Laboratory, California Institute of Technology, pp. 19–29, paper presented at a Conference on Feb. 7–8, 1994 in San Jose, CA.

Kawashima, H. et al., A ¼ Inch Format 250K Pixel Amplified MOS Image Sensor Using CMOS Process, 1993 *IEEE*, pp. 575–578, Tokyo, Japan.

Dickinson, A. et al., A 256×256 CMOS Active Pixel Image Sensor with Motion Detection, ISSCC95/Session 13/Image Sensors and Systems/Paper TP 13.5, 1995 *IEEE* International Solid–State Circuits Conf., Feb. 16, 1995, Pasadena, CA.

*Primary Examiner*—Minh-Loan Tran
*Attorney, Agent, or Firm*—Limbach & Limbach LLP

[57] ABSTRACT

The stress placed on the silicon lattice of a photodiode during the formation of field oxide regions by the local oxidation of silicon (LOCOS) is eliminated in the present invention by utilizing a negatively-charged layer of polysilicon to isolate the implanted n-type region of the photodiode from the implanted regions of adjacent photodiodes or other devices. In addition, stress is further reduced in the present invention by forming the n-type region of the photodiode with phosphorous, and by lowering the dose such that the n-type region is lightly doped.

7 Claims, 2 Drawing Sheets

LOW-STRESS PHOTODIODE WITH REDUCED JUNCTION LEAKAGE

BACKGROUND OF THE INVENTION

1. Field of the Invention

The present invention relates to photodiodes and, more particularly, to a low-stress photodiode that provides reduced junction leakage.

2. Description of the Related Art

Conventional imaging circuits rely on photodiodes to convert a pixel of light energy into an electrical charge that represents the intensity of the light energy. In general, the light energy varies the electrical charge in a manner which is proportional to the photon absorption rate.

FIG. 1 shows a cross-sectional diagram that illustrates a conventional photodiode 10. As shown in FIG. 1, photodiode 10 includes an n+ region 14, which is formed in a p-type substrate 12, along with field oxide regions FOX which isolate n+ region 14 from adjacent n+ and p+ regions.

In operation, n+ region 14 is initially reverse-biased with respect to p-type substrate 12, and then floated. Under these conditions, light energy, in the form of photons, strikes photodiode 10, thereby creating a number of electron-hole pairs in both n+ region 14 and the underlying p-type substrate 12.

The holes formed in n+ region 14, in turn, diffuse to the p-n junction where they are swept to the p-type substrate 12 under the influence of the electric field. Similarly, the electrons formed in p-type substrate 12 diffuse to the p-n junction where they are swept to n+ region 14.

Thus, with the addition of each photogenerated electron in n+ region 14, the voltage on n+ region 14 is correspondingly reduced. (The depth of the junction as well as the thickness of substrate 12 are designed to limit recombination of the photogenerated electron-hole pairs). As a result, photodiode 10 varies the voltage on n+ region 14 in a manner which is proportional to the photon absorption rate.

One major problem with conventional photodiodes, however, is junction leakage. Experimental results indicate that the dynamic range of conventional photodiodes is limited by junction leakage to 10 bits at room temperature. In addition, these results also indicate that the leakage current increases by 20X with every 30° C. increase in temperature.

By contrast, thermal (kT/C) noise limits dynamic range to about 13 bits and represents the fundamental limit on the dynamic range. (1/f noise is actually worse than leakage noise at room temperature, but can usually be eliminated by correlated double sampling techniques).

Junction leakage is widely believed to be caused by lattice defects that result from stress placed on the lattice. One well-known source of stress results from the formation of field oxide regions FOX by the local oxidation of silicon (LOCOS) process.

With the LOCOS process, a layer of pad or buffer oxide is formed over the substrate, followed by the formation of an overlying layer of nitride. Selected portions of the layer of nitride and the underlying layer of pad oxide are then removed to expose portions of the silicon substrate where the field oxide regions will be formed. After this, a channel-stop implant is performed, followed by the thermal growth of the field oxide regions.

As the oxide grows, however, the oxide pushes against the sides of the nitride/oxide openings. The stiffness of the nitride layer restrains the oxide from growing upward, thereby causing downward stress against the silicon along the corner of the growing oxide. Further stress along the corner is caused by the volume misfit of the growing oxide. These stresses, in turn, generate dislocations in the silicon.

Another source of stress results from the implantation step used to form n+ region 14. As is well known, n+ region 14 is conventionally formed by implanting arsenic ($As_+$) atoms into substrate 12. When the arsenic atoms are implanted, the atoms lose their energy in a series of collisions that produce defects in the lattice. (Arsenic is conventionally implanted with an implant energy of 30 Kev to form a dose of $3.0 \times 10^{15}$ atoms/cm$^2$).

Although it is difficult to characterize the exact nature of the stress-induced damage discussed above, the lattice defects are thought to trap clusters of arsenic atoms. The clustering of arsenic atoms is then thought to provide an excellent gettering site which, in turn, tends to increase the junction leakage.

Thus, in view of the above, lattice stress appears to be a significant source of junction leakage. As a result, there is a need for a photodiode which reduces the stress placed on the lattice, thereby reducing the junction leakage and increasing the dynamic range of the photodiode.

SUMMARY OF THE INVENTION

The present invention provides a photodiode that reduces the stress placed on the silicon lattice by replacing the field oxide regions conventionally used to isolate the implanted region of the photodiode with a negatively-charged layer of polysilicon, and by changing the material and dose used to form the implanted region.

In the present invention, the photodiode, which is formed in a substrate of a first conductivity type, includes a region of a second conductivity type which is formed in the substrate such that an upper surface of the region adjoins an upper surface of the substrate. In addition, the photodiode also includes a layer of dielectric material which is formed over the substrate.

In accordance with the present invention, the photodiode further includes a layer of conductive material which is formed over the layer of dielectric material such that the layer of conductive material is formed over the upper surface of the substrate that adjoins the upper surface of the region. As a result, the layer of conductive material encloses the region.

In addition, rather than utilizing arsenic to form the region of second conductivity, as is conventionally the case, the region can also be formed with phosphorous at a dose within the approximate range of $5 \times 10^{12} - 1 \times 10^{14}$ atoms/cm$^2$.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
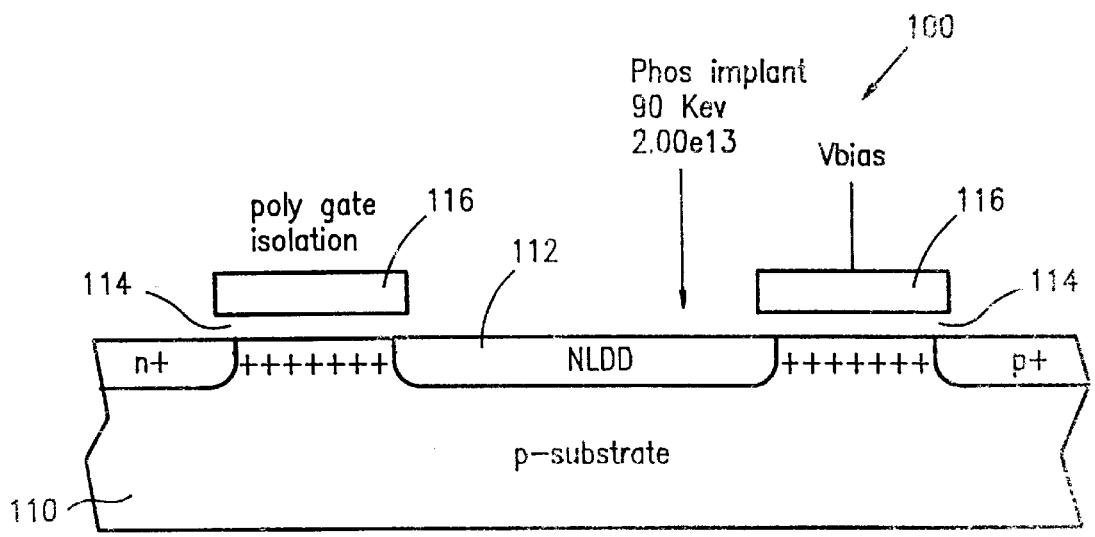
FIG. 2 is a cross-sectional diagram illustrating a photodiode 100 in accordance with the present invention.

FIG. 2 shows a cross-sectional diagram of a photodiode 100 in accordance with the present invention. As described in greater detail below, photodiode 100 eliminates the stress placed on the silicon lattice as a result of the formation of field oxide by the local oxidation of silicon (LOCOS) by utilizing a negatively-charged layer of polysilicon to isolate the implanted region of the photodiode from adjacent implanted regions. In addition, stress is further reduced in the present invention by changing the material and dose used to form the implanted region.

As shown in FIG. 2, photodiode 100 includes an n+ implanted region 112 which is formed in a p-type semiconductor substrate 110, and a layer of gate oxide 114 which is formed over substrate 110. Thus, an upper surface of n-type region 112 adjoins an upper surface of substrate 110 which, in turn, is covered by the layer of oxide 114.

In accordance with the present invention, photodiode 100 also includes a layer of polysilicon 116 which is formed over the layer of gate oxide 114 such that the layer of polysilicon 116 is formed over the upper surface of substrate 110 that adjoins the upper surface of n-type region 112. As a result, the layer of polysilicon 116 encloses n-type region 112.

Figure 3:
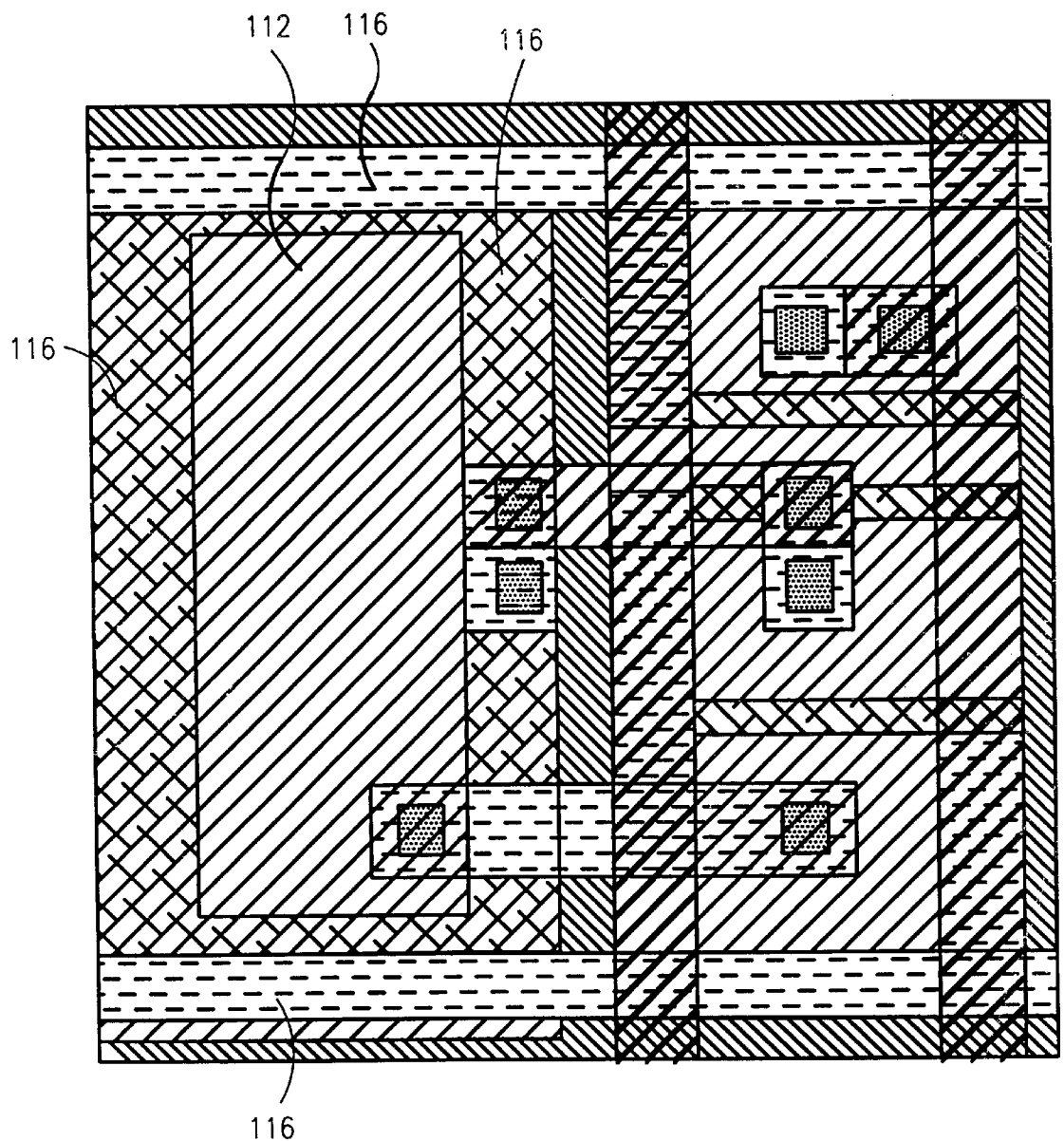
FIG. 3 shows a plan view that illustrates photodiode 100 formed as part of an active pixel sensor cell.

FIG. 3 shows a plan view that illustrates photodiode 100 formed as part of an active pixel sensor cell. As shown in FIG. 3, by enclosing n-type region 112, the layer of polysilicon 116 isolates n-type region 112 from the implanted regions of other adjacent devices.

In operation, the layer of polysilicon 116, which is conventionally doped, is continuously biased with a negative voltage. Thus, as shown in FIG. 2, positively-charged holes from substrate 110 are attracted to the surface of substrate 110 which, in turn, electrically isolates adjacent implanted regions from each other.

As a result, the present invention eliminates the need for the field oxide regions that are conventionally used to isolate the n-type region of the photodiode, thereby eliminating the stress associated with the formation of the field oxide regions.

In accordance with the present invention, rather than forming n-type region 112 to be heavily doped stress on the lattice is further reduced by implanting n-type region 112 with phosphorous to form a lightly-doped implanted region. In the present invention, the dose is preferably $2 \times 10^{13}$ atoms/cm$^2$ which is equivalent to the dose that is commonly used to form the N- region of a lightly doped drain (LDD). Alternately, the dose may also be within the approximate range of $5 \times 10^{12}$–$1 \times 10^{14}$ atoms/cm$^2$. In addition, the preferred implant energy is 90 Kev, but any implant energy within the approximate range of 30–180 Kev may also be used.

Figure 1:
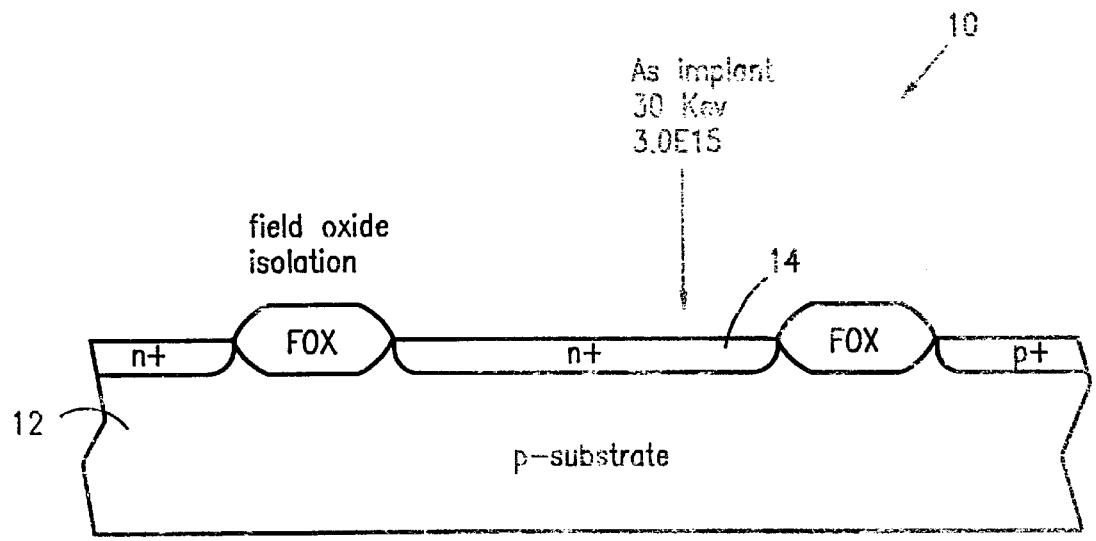
FIG. 1 is a cross-sectional diagram illustrating a conventional photodiode 10.

In the present invention, the use of a lightly-doped phosphorous region 112 may be used in conjunction with the layer of polysilicon 116, as shown in FIG. 2, or may be used to form the implanted region of a conventionally structured photodiode, as shown in FIG. 1.

One significant advantage of the present invention is that the layer of polysilicon 116 and the phosphorous-doped n-type region 112 can be formed with a conventional CMOS fabrication process without adding any additional process steps. The layer of polysilicon can be formed during the same process steps that are utilized to form the gates of MOS transistors, while the lightly-doped implanted region can be formed during the same process steps that are used to form the N- region of a lightly doped drain.

Thus, in accordance with the present invention, a photodiode has been described which reduces stress and thereby limits junction leakage. In addition, because only MOS compatible structures are utilized, the present invention is easily integrated with standard CMOS fabrication processes.

It should be understood that various alternatives to the embodiment of the invention described herein may be employed in practicing the invention. For example, although the operation of the present invention has been described with respect to an n+/p- photodiode, the present invention applies equally well to p+/n- photodiodes.

Similarly, those skilled in the art will also understand that other dielectrics can be used in lieu of the layer of gate oxide 114, and that other conductive materials can be used in lieu of the layer of doped polysilicon 116.

Thus, it is intended that the following claims define the scope of the invention and that methods and structures within the scope of these claims and their equivalents be covered thereby.

What is claimed is:

1. A photodiode formed in a semiconductor substrate of a first conductivity type, the photodiode comprising:

a region of a second conductivity type formed in the substrate such that an upper surface of the region adjoins an upper surface of the substrate;

a layer of dielectric material formed over the upper surface of the substrate; and a single layer of conductive material formed over the layer of dielectric material such that the single layer of conductive material is formed over the upper surface of the substrate that adjoins the upper surface of the region to enclose the region.

2. The photodiode of claim 1 wherein the region is implanted with an n-type material.

3. The photodiode of claim 2 wherein the n-type material is phosphorous.

4. The photodiode of claim 3 wherein the dose of the phosphorous implant is within the approximate range of $5 \times 10^{12}$–$1 \times 10^{14}$ atoms/cm$^2$ and the semiconductor substrate comprises silicon.

5. The photodiode of claim 1 wherein the layer of dielectric material includes gate oxide.

6. The photodiode of claim 1 wherein the layer of conductive material includes doped polysilicon.

7. The photodiode of claim 1 wherein the region is implanted to have a lightly-doped-drain (LDD) concentration.

* * * * *